United States Patent

De Samber et al.

[11] Patent Number: 5,814,554
[45] Date of Patent: Sep. 29, 1998

[54] SEMICONDUCTOR DEVICE PROVIDED WITH A MICROCOMPONENT HAVING A FIXED AND A MOVABLE ELECTRODE

[75] Inventors: Mark A. De Samber; Wilhelmus Peters, both of Eindhoven, Netherlands

[73] Assignee: U.S. Philips Corporation, New York, N.Y.

[21] Appl. No.: 561,573

[22] Filed: Nov. 21, 1995

[30] Foreign Application Priority Data

Nov. 23, 1994 [EP] European Pat. Off. .............. 94203409

[51] Int. Cl.$^6$ ................................................... H01L 21/44
[52] U.S. Cl. .............................. 438/611; 438/50; 438/52; 438/53; 438/739
[58] Field of Search ................................... 438/611, 739, 438/52, 53, 50

[56] References Cited

U.S. PATENT DOCUMENTS

| | | | |
|---|---|---|---|
| 4,948,757 | 8/1990 | Jain et al. ................................ | 437/240 |
| 5,262,000 | 11/1993 | Welbourn et al. . | |
| 5,326,726 | 7/1994 | Tsang et al. ............................. | 437/228 |
| 5,587,343 | 12/1996 | Kano et al. . | |

FOREIGN PATENT DOCUMENTS

0604212A1  6/1994  European Pat. Off. . .

OTHER PUBLICATIONS

"Silicon Processing for the VLSI Era", vol. II, by S. Wolf, Lattice Press, p. 188 only.

Primary Examiner—Caridad Everhart
Attorney, Agent, or Firm—Steven R. Biren

[57] ABSTRACT

A method of manufacturing a semiconductor device is disclosed in which semiconductor switching elements (2) and an integrated microcomponent (3) with a fixed electrode (6) and an electrode (7) which is movable relative to the fixed electrode (6) are provided adjacent a surface of a semiconductor slice (1), which slice (1) is subsequently subdivided into individual semiconductor devices. After the semiconductor switching elements (2) have been provided, metal conductor tracks (20) of a first level are provided on the surface which form the fixed electrode (6) and electrical connections (9), over which an insulating layer (21) and metal conductor tracks (22) of a second level are provided, which form the movable electrode (7) and further electrical connections (8), after which the insulating layer (21) between the fixed (6) and the movable electrode (7) is removed. The semiconductor switching elements (2) are thus manufactured first, after which during the application of the metallization of the device the microcomponent (3) is also manufactured. Since the electrodes (6, 7) of the microcomponent are manufactured by means of conductor tracks (20, 22) at the two metallization levels, it suffices to adapt the metallization stage ("back end") of the manufacturing process only for the creation of a microcomponent (3). A standard process may accordingly be taken for the manufacture of the semiconductor elements (2). The manufacture of the device thereby becomes simpler and cheaper.

5 Claims, 2 Drawing Sheets

SEMICONDUCTOR DEVICE PROVIDED WITH A MICROCOMPONENT HAVING A FIXED AND A MOVABLE ELECTRODE

BACKGROUND OF THE INVENTION

The invention relates to a method of manufacturing a semiconductor device semiconductor switching elements and an integrated microcomponent having a fixed electrode and an electrode which is movable relative to said fixed electrode are provided adjacent a surface of a semiconductor slice, after which the slice is subdivided into individual semiconductor devices. The invention also relates to a semiconductor device with a semiconductor substrate provided with semiconductor switching elements and an integrated microcomponent having a fixed electrode and an electrode which is movable relative to said fixed electrode.

Such a method is particularly suitable for manufacturing semiconductor devices for measuring and processing mechanical accelerations or forces. The microcomponent then is, for example, a capacitive acceleration transducer in which a movement of the movable electrode relative to the fixed electrode results in a capacitance change or in an electrical contact between the electrodes. The movable electrode may alternatively be provided with a mirroring surface and act as a movable mirror, such that the application of a voltage across the electrodes moves the mirror and light incident on the mirror is or is not visibly reflected or deflected. The semiconductor switching elements such as, for example, transistors or diodes, form part, for example, of a semiconductor circuit which processes or controls the capacitance change between the electrodes, the electrical contact between the electrodes, or the movement of the mirror.

U.S. Pat. No. 5,326,726 discloses a method of the kind mentioned in the opening paragraph whereby a semiconductor device is manufactured with an acceleration transducer as the microcomponent. The microcomponent comprises a fixed electrode formed in a region adjoining the surface and a movable electrode of polycrystalline silicon.

The known method described has the disadvantage that very many process steps are necessary for manufacturing the microcomponent, and that these process steps interfere with the process steps for manufacturing the semiconductor elements in the semiconductor slice.

SUMMARY OF THE INVENTION

The invention has for its object inter alia to counteract said disadvantage.

According to the invention, the method is for this purpose characterized in that, after the semiconductor switching elements have been provided, metal conductor tracks of a first level are provided on the surface which form the fixed electrode and electrical connections, over which an insulating layer and metal conductor tracks of a second level are provided which form the movable electrode and further electrical connections, after which the insulating layer between the fixed and the movable electrode is removed.

In the method according to the invention, accordingly, first the semiconductor switching elements are manufactured, and then the microcomponent is manufactured simultaneously while the metallization of the device is being provided. The device is manufactured in a so-called double-level metal structure technology, in which metal tracks at at least two levels are used. This technology is described in S. Wolf: "Silicon Processing for the VLSI Era", vol. 2, p. 188, Lattice Press. The conductor tracks at two or more metallization levels are used for achieving electrical connections, for example, between semiconductor switching elements, for connections to, for example, contact surfaces, for fastening bonding wires, or for connections between the microcomponent and the switching elements. Such metal conductor tracks are provided in a final stage ("back end") of the manufacture of the device. Since the electrodes of the microcomponent are manufactured by means of conductor tracks at the two metallization levels, it suffices to adapt the "back end" of the manufacturing process for adding a microcomponent. This means that a standard process can be used for manufacturing the semiconductor elements in the semiconductor slice. This makes the manufacture of the device simpler and cheaper.

Preferably, the method according to the invention is characterized in that, after the conductor tracks of the second level have been provided, a protective layer is applied which is removed at the area of the microcomponent such that portions of the protective layer remain on the movable electrode, after which the insulating layer between the fixed and the movable electrode is removed. The mass of the movable electrode can be attuned in this manner. Preferably, a variation in diameter which influences the stiffness of the movable electrode is provided in the conductor track where the latter forms the movable electrode. It is possible by means of this variation in diameter to attune accurately the stiffness of the movable electrode. The stiffness S is here understood to be the force K necessary for achieving a certain deflection x divided by this deflection, according to the equation $S=K/x$. An identical force will lead to a greater deflection when, for example, the movable electrode is given a smaller cross-section locally, i.e. the stiffness decreases. The movable electrode may comprise one segment. Preferably, the movable electrode is subdivided into two segments which are separated by a portion having a cross-section of smaller dimensions. It is possible then for the movable electrode to have a segment of greater stiffness and a segment of smaller stiffness. The segment of greater stiffness may be used, for example, for generating a reference voltage in a capacitive acceleration transducer. The microcomponent may be extra sensitive in a certain frequency range, for example, subject to the stiffness and mass of the movable electrode.

A particular advantage is obtained when in the method, after the manufacture of the semiconductor elements and the microcomponent, the semiconductor slice is connected with its surface to a cover plate which is provided with cavities, such that the microcomponents are screened by the cavities after the connection, upon which the semiconductor slice and the cover plate are subdivided into individual semiconductor devices with microcomponents, the latter being screened each by a portion of the cover plate. It is possible then to manufacture and envelop many switching elements and microcomponents at wafer level. After splitting-up, individual semiconductor devices with microcomponents are created, each screened by a portion of the cover plate. It is possible then, for example, to envelop the semiconductor devices in an epoxy resin by a standard method without the movable electrode getting stuck in the resin.

The invention also relates to a semiconductor device with a semiconductor substrate provided with semiconductor switching elements and an integrated microcomponent having a fixed electrode and an electrode which is movable relative to the fixed electrode. According to the invention, this device is provided with metal conductor tracks at two levels, the fixed electrode comprising a metal conductor track at a first of the two levels and the movable electrode comprising a metal conductor track at a second of the two levels. Such a semiconductor device may be manufactured in a simple manner as described above.

BRIEF DESCRIPTION OF THE DRAWING

The invention will be explained below in more detail, by way of example, with reference to the drawing, in which.

Figure 1:
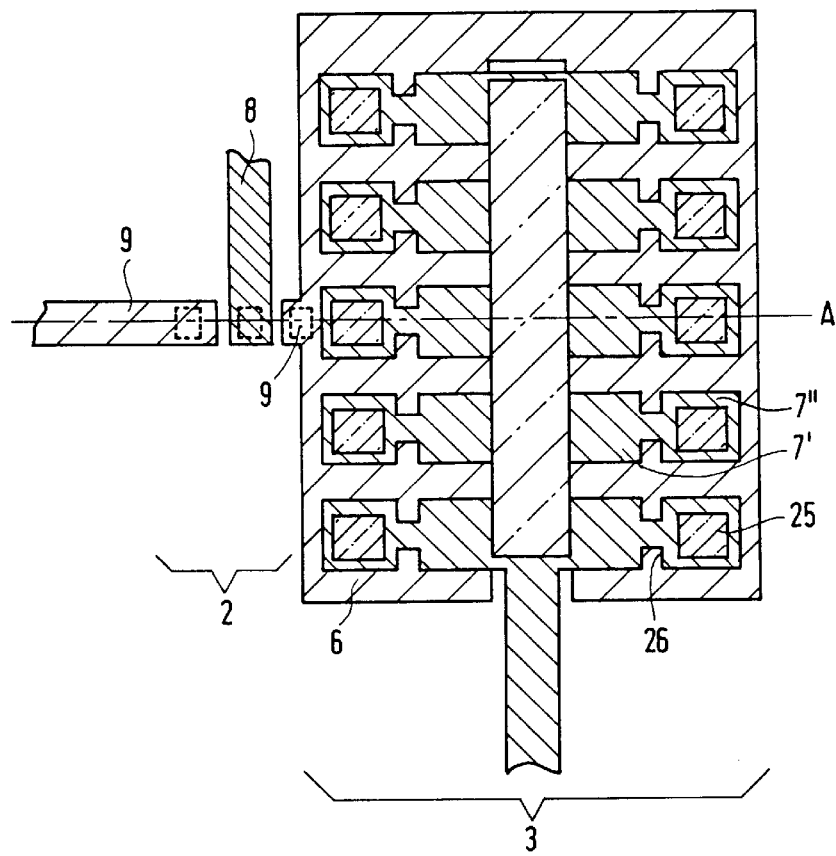
FIG. 1 is a plan view of a portion of a capacitive accelerometer of the so-called double-metal back end type.

The Figures are purely diagrammatic and not drawn to scale.

Corresponding parts have generally been given the same reference numerals in the Figures.

DESCRIPTION OF THE PREFERRED EMBODIMENTS

Figure 2:
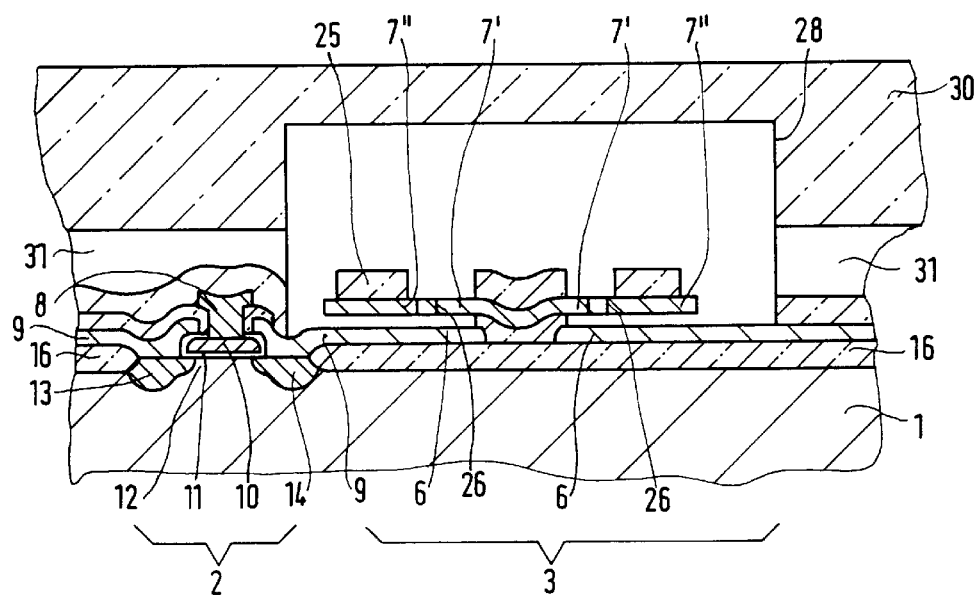
FIG. 2 is a cross-section taken on the line A—A in FIG. 1 of a capacitive accelerometer of the double-metal back end type.

FIG. 1 is a plan view and FIG. 2 a cross-section taken on the line A—A in FIG. 1 of a capacitive accelerometer manufactured by the method according to the invention. Semiconductor switching elements 2 and an integrated microcomponent 3 with a fixed electrode 6 and an electrode 7 which is movable relative to the fixed electrode 6 are provided so as to adjoin a surface of a semiconductor slice 1 of silicon, after which the slice 1 is subdivided into individual semiconductor devices. The individual semiconductor devices then comprise, for example, one microcomponent and the switching elements which process the signals originating from the microcomponent.

Figure 3:
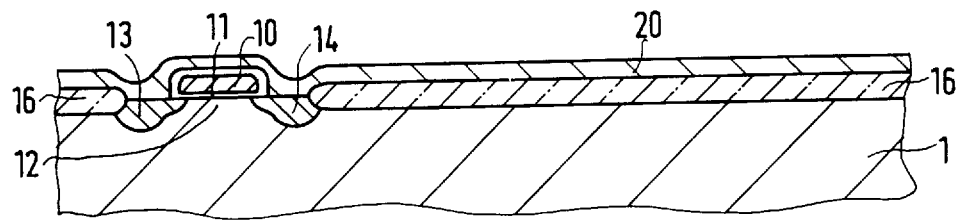
FIGS. 3 to 5 are cross-sections taken on the line A—A in FIG. 1 in various stages of the manufacture of the capacitive accelerometer.
Figure 4:
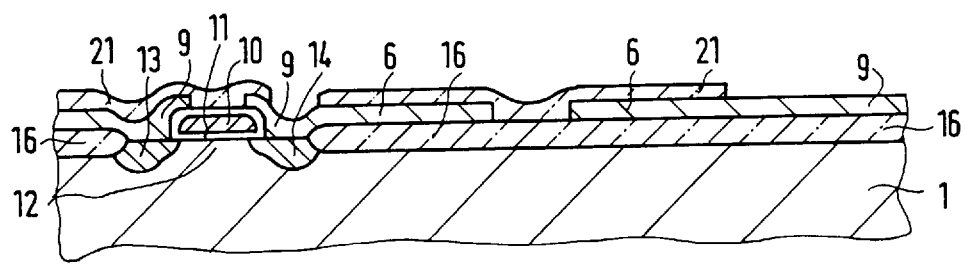
Figure 5:
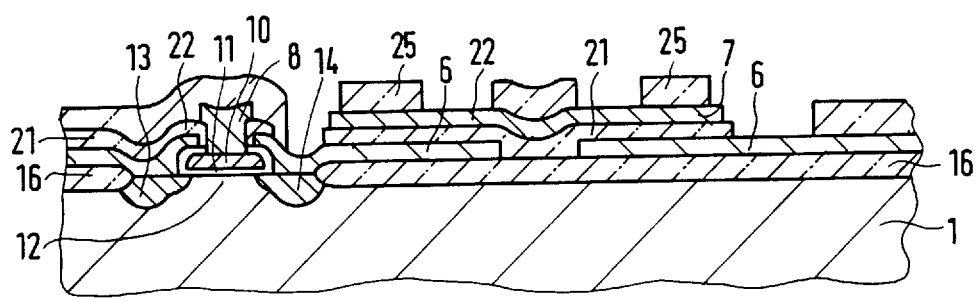

Such a semiconductor device is manufactured in that first the semiconductor switching elements 2 are manufactured in a known manner by standard techniques. FIG. 2 shows a semiconductor slice 1 provided with a switching transistor 2 as the semiconductor element. The switching transistor is provided with a gate electrode 10 of polycrystalline silicon which is separated from a channel region 12 by gate oxide 11. The gate electrode 10 is circumferentially covered with silicon oxide. A source and a drain region 13, 14 of a doping type opposite to the doping type of the semiconductor slice 1 adjoin the channel region 12. One switching transistor 1 and one microcomponent 3 are drawn in the Figures. In practice, however, many transistors and several microcomponents may be present in the semiconductor device. In the present example, the transistor 2 is separated from other transistors and from the portion of the slice where the microcomponent 3 is manufactured by locally recessed oxide layers 16. FIG. 3 shows how a metal layer of a first level is provided on the surface of the slice 1, in this example a sputtered aluminium layer of 0.5 $\mu$m thickness. This layer is patterned in known manner by photolithographical techniques and etching, whereby metal conductor tracks are formed which constitutes the fixed electrode 6 and electrical connections 9 (see FIG. 4). The electrical connections 9 in this example connect the source region 13 to further transistors (not shown) and connect the drain region 14 to the fixed electrode 6. A 0.8 $\mu$m thick insulating silicon oxide layer 21 is provided over these metal tracks of the first level in known manner by a deposition from the gas phase (CVD). The insulating layer 21 covers the metal layer 20 of the first level. Subsequently, the insulating layer 21 is patterned in a known manner (see FIG. 4). Then a 1 $\mu$m thick aluminium layer 22 is provided on the insulating layer 21 in a sputtering process and patterned in a known manner, whereby metal conductor tracks of a second level are formed, constituting the movable electrode 7 and further electrical connections 8 (see FIG. 5). A further electrical connection 8 connects, for example, the gate electrode 10 to further parts of the semiconductor device. After the conductor tracks 7, 8 of the second level have been provided, a protective layer is applied, in this example of silicon nitride, which is so removed at the area of the microcomponent 3 that portions 25 of the protective layer remain on the movable electrode 7, after which the insulating layer 21 is removed from between the fixed and the movable electrode 7 by a wet-chemical etching method in a known silicon oxide etching bath. The mass of the movable electrode 7 can be adjusted in this manner. Preferably, a variation 26 in the cross-sectional dimensions of the movable electrode 7, which influences the stiffness of this electrode 7, is applied in the conductor track 7 where the latter forms the movable electrode 7. In FIG. 1, the cross-section is reduced through the application of a narrowing 26 which reduces the stiffness of the electrode 7. It is possible by means of this narrowing 26 to fine-tune the stiffness of the movable electrode 7. The microcomponent 3 may then be extra sensitive in a certain frequency range, subject to the stiffness and the mass of the movable electrode 7. The movable electrode 7 in FIG. 1 is subdivided into two segments 7' and 7" separated by a portion with a cross-section of smaller dimensions 26. The movable electrode 7 then comprises a segment 7' of greater stiffness and a segment 7" of smaller stiffness. The segment 7' of greater stiffness in this example is used for generating a reference voltage. In an alternative embodiment, it is obviously possible for the movable electrode 7 to comprise only one segment instead of the two segments 7' and 7" as sketched in FIG. 1.

In this example, the semiconductor slice 1 is connected by its surface to a cover plate 30 provided with cavities 28 after the manufacture of the semiconductor elements 2 and the microcomponents 3, after which connection the microcomponents 3 are screened by the cavities 28 (see FIG. 2). A glass plate is used as the cover plate in this example, provided with the cavities 28 by means of an etching process. The cavities 28 in this example are recesses which are in connection with only one surface of the glass plate. In alternative embodiments, for example in pressure sensors, the cavity may also be in connection with another surface of the glass plate opposite to the former surface. The glass plate 30 may also be provides with holes which render bond pads of the semiconductor device accessible for connection of bonding wires. In this example, the glass plate is provided with a glue layer 31 which can be cured with UV (ultraviolet) radiation. The glass plate 30 with the glue layer 31 is placed on the semiconductor slice 1, after which the glue layer 31 is cured by means of UV radiation through the glass plate 30. Then the semiconductor slice 1 and the cover plate 30 are subdivided into individual semiconductor devices with microcomponents 3, each screened by a portion of the cover plate 30. It is thus possible to manufacture and envelop many switching elements 2 and microcomponents 3 at wafer level. After subdivision, individual semiconductor devices with microcomponents 3 are created, each screened by a portion of the cover plate. It is then possible, for example, to envelop the semiconductor devices in a standard manner with an epoxy resin without the movable electrode 7 getting stuck in the resin.

The invention is not limited to the embodiment described above, many variations being possible within the scope of the invention. Thus an insulating layer and conductor tracks of a third level may be applied over the conductor tracks of the second level, the conductor tracks of the third level forming a second fixed electrode of the microcomponent 3 and further electrical connections, after which the insulating layers between the fixed and the movable electrodes are removed. Conductor tracks at a third level may thus be used for manufacturing a differential transducer, in which a movable electrode lies between two fixed electrodes. Such a differential transducer is more sensitive than a transducer having only one fixed electrode. In addition, the read-out electronics for such a differential transducer are easier to realise.

It is furthermore possible for a bipolar transistor, resistor, diode, etc. to be used as the switching element instead of a MOS transistor as shown in the Figures. Furthermore, the movable electrode 7 may comprise only one segment instead of the two segments 7' and 7" as shown in FIG. 1.

It is also possible by the method according to the invention to manufacture, for example, a relay circuit in which a fixed and a movable electrode act as a relay. Short-circuiting or not short-circuiting of the fixed and movable electrode is then used for the switching of currents. The method may also be used for manufacturing an actuator or, for example, a display. In the latter case, the movable electrode 7 is provided with a mirroring surface in that, for example, a metal having a mirroring surface is used for the movable electrode, or the movable electrode is provided, for example, with a silver layer. The movable electrode is then controlled by means of a voltage between the movable and the fixed electrode. Variation of this voltage can move the movable electrode. It is possible thereby, for example, to reflect a light beam such that the light beam is or is not projected onto a surface.

It will be obvious that metals other than the metals mentioned in the embodiment can be used, for example, titanium or tungsten may alternatively be used for the first and the second level. Furthermore, insulating layers other than those mentioned may be used between the metal layers of the various levels. It is possible to use oxides, nitrides, or oxynitrides. Certain techniques for manufacturing the semiconductor device were mentioned above. This implies by no means that the method according to the invention can only be implemented by these techniques. Thus, for example, an alternative technique such as, for example, deposition from the gas phase (CVD) may be used for depositing the metal layers at the two levels instead of a sputtering process. A spin-on glass (SOG) technique may be used as an alternative for the deposition of the insulating oxide layer 21. More details on known techniques and materials to be used can be found in handbooks such as S. M. Sze: "VLSI Technology", Mc-Graw-Hill Book Company, and S. Wolf: "Silicon Processing for the VLSI Era", vol. 1, 2, Lattice Press.

We claim:

1. A method of manufacturing a semiconductor device whereby semiconductor switching elements and an integrated microcomponent having a fixed electrode and an electrode which is movable relative to said fixed electrode are provided adjacent a surface of a semiconductor slice, after which the slice is subdivided into individual semiconductor devices, wherein, after the semiconductor switching elements have been provided, metal conductor tracks of a first level are provided on the surface which form the fixed electrode and electrical connections to at least one semiconductor switching element, over which an insulating layer and metal conductor tracks of a second level are provided which form the movable electrode and further electrical connections to at least one semiconductor switching element, after which the insulating layer between the fixed and the movable electrode is removed.

2. A method as claimed in claim 1, characterized in that, after the conductor tracks of the second level have been provided, a protective layer is applied which is removed at the area of the microcomponent such that portions of the protective layer remain on the movable electrode, after which the insulating layer between the fixed and the movable electrode is removed.

3. A method as claimed in claim 1, characterized in that a variation in diameter which influences the stiffness of the movable electrode is provided in the conductor track where the latter forms the movable electrode.

4. A method as claimed in claim 3, characterized in that the movable electrode is subdivided into two segments which are separated by a portion having a cross-section of smaller dimensions.

5. A method as claimed in claim 1, characterized in that, after the manufacture of the semiconductor elements and the microcomponent, the semiconductor slice is connected with its surface to a cover plate which is provided with cavities, such that the microcomponents are screened by the cavities after the connection, upon which the semiconductor slice and the cover plate are subdivided into individual semiconductor devices with microcomponents, the latter being screened each by a portion of the cover plate.

* * * * *